US006808606B2

(12) United States Patent
Thomsen et al.

(10) Patent No.: US 6,808,606 B2
(45) Date of Patent: Oct. 26, 2004

(54) METHOD OF MANUFACTURING WINDOW USING ION BEAM MILLING OF GLASS SUBSTRATE(S)

(75) Inventors: Scott V. Thomsen, Milford, MI (US); Rudolph Hugo Petrmichl, Ann Arbor, MI (US); Vijayen S. Veerasamy, Ann Arbor, MI (US); Anthony V. Longobardo, Howell, MI (US); Henry A. Luten, Ypsilanti, MI (US); David R. Hall, Jr., Detroit, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 10/238,052

(22) Filed: Sep. 10, 2002

(65) Prior Publication Data

US 2003/0064198 A1 Apr. 3, 2003

Related U.S. Application Data

(63) Continuation-in-part of application No. 10/074,685, filed on Feb. 14, 2002, now Pat. No. 6,740,211, said application No. 10/238,052, is a continuation-in-part of application No. 10/119,032, filed on Apr. 10, 2002, now Pat. No. 6,592,993, which is a division of application No. 09/927,507, filed on Aug. 13, 2001, now Pat. No. 6,395,333, which is a division of application No. 09/442,805, filed on Nov. 18, 1999, now Pat. No. 6,338,901, which is a continuation-in-part of application No. 09/303,548, filed on May 3, 1999, now Pat. No. 6,261,693, said application No. 10/238,052, is a continuation-in-part of application No. 10/003,436, filed on Dec. 6, 2001, which is a continuation of application No. 09/703,709, filed on Nov. 2, 2000, now Pat. No. 6,368,664, which is a continuation-in-part of application No. 09/657,132, filed on Sep. 7, 2000, now Pat. No. 6,277,480, which is a continuation-in-part of application No. 09/627,441, filed on Jul. 28, 2000, now Pat. No. 6,280,834.

(51) Int. Cl.$^7$ .......................... C23C 14/34; C23C 16/00
(52) U.S. Cl. ........................ 204/192.3; 204/192.34; 204/192.26; 204/192.27; 204/192.28; 427/523; 427/524; 427/527; 216/66; 216/79; 216/80

(58) Field of Search .................... 204/192.26, 192.27, 204/192.28, 192.3, 192.34; 427/523, 524, 527; 216/66, 79, 80

(56) References Cited

U.S. PATENT DOCUMENTS

| 3,682,528 A | 8/1972 | Apfel et al. ............. 359/360 |
| 4,152,188 A | 5/1979 | Friedrich et al. ......... 156/212 |
| 4,782,216 A | 11/1988 | Woodard ................ 219/547 |
| 4,820,902 A | 4/1989 | Gillery ................. 219/203 |
| 4,898,789 A | 2/1990 | Finley ................. 428/623 |
| 4,965,121 A | 10/1990 | Young et al. ............ 428/213 |
| 5,332,888 A | 7/1994 | Tausch et al. ........... 219/547 |
| 5,377,045 A | 12/1994 | Wolfe et al. ............ 359/585 |
| 5,378,527 A | 1/1995 | Nakanishi et al. ........ 428/216 |
| 5,443,669 A | 8/1995 | Tünker ................. 156/102 |
| 5,443,862 A | 8/1995 | Buffat et al. ........... 427/526 |
| 5,472,566 A | 12/1995 | Swann et al. .......... 204/192.34 |
| 5,508,092 A | 4/1996 | Kimock et al. .......... 428/216 |
| 5,508,368 A | 4/1996 | Knapp et al. ........... 427/534 |
| 5,514,476 A | 5/1996 | Hartig et al. ........... 428/426 |

(List continued on next page.)

Primary Examiner—Rodney G. McDonald
(74) Attorney, Agent, or Firm—Nixon & Vanderhye P.C.

(57) ABSTRACT

This invention relates to a method of making a window (e.g., vehicle windshield, architectural window, etc.), and the resulting window product. At least one glass substrate of the window is ion beam treated and/or milled prior to application of a coating (e.g., sputter coated coating) over the treated/milled substrate surface and/or prior to heat treatment. As a result, defects in the resulting window and/or haze may be reduced. The ion beam used in certain embodiments may be diffused. In certain embodiments, the ion beam treating and/or milling is carried out using a fluorine (F) inclusive gas(es) and/or argon/oxygen gas(es) at the ion source(s). In certain optional embodiments, F may be sub-implanted into to treated/milled glass surface for the purpose of reducing Na migration to the glass surface during heat treatment or thereafter, thereby enabling corrosion and/or stains to be reduced for long periods of time.

51 Claims, 11 Drawing Sheets

U.S. PATENT DOCUMENTS

| | | | |
|---|---|---|---|
| 5,518,595 A | 5/1996 | Yamakage | 204/192.34 |
| 5,521,765 A | 5/1996 | Wolfe | 359/885 |
| 5,557,462 A | 9/1996 | Hartig et al. | 359/585 |
| 5,563,734 A | 10/1996 | Wolfe et al. | 359/360 |
| 5,580,419 A | 12/1996 | Berenz | 438/171 |
| 5,635,245 A | 6/1997 | Kimock et al. | 427/249.7 |
| 5,653,812 A | 8/1997 | Petrmichl et al. | 118/723 E |
| 5,744,400 A | 4/1998 | Dyer | 438/631 |
| 5,858,477 A | 1/1999 | Veerasamy et al. | 427/562 |
| 5,888,593 A | 3/1999 | Petrmichl et al. | 427/563 |
| 6,002,208 A | 12/1999 | Maishev et al. | 315/111.91 |
| 6,059,909 A | 5/2000 | Hartig et al. | 156/109 |
| 6,086,774 A | 7/2000 | Ho et al. | 216/11 |
| 6,130,012 A | 10/2000 | May et al. | 430/5 |
| 6,236,543 B1 | 5/2001 | Han et al. | 360/236.6 |
| 6,261,672 B1 | 7/2001 | de Paoli | 428/213 |
| 6,261,693 B1 | 7/2001 | Veerasamy | 428/408 |
| 6,277,480 B1 | 8/2001 | Veerasamy et al. | 428/217 |
| 6,280,834 B1 | 8/2001 | Veerasamy et al. | 428/217 |
| 6,280,847 B1 | 8/2001 | Corkhill et al. | 428/423.1 |
| 6,312,808 B1 | 11/2001 | Veerasamy et al. | 428/408 |
| 6,335,086 B1 | 1/2002 | Veerasamy | 428/217 |
| 6,338,901 B1 | 1/2002 | Veerasamy | 429/408 |
| 6,359,388 B1 | 3/2002 | Petrmichl | 315/111.81 |
| 6,368,664 B1 | 4/2002 | Veerasamy et al. | 427/249.7 |
| 6,395,333 B2 | 5/2002 | Veerasamy | 427/249.7 |
| 2002/0081378 A1 * | 6/2002 | Veerasamy et al. | 427/165 |

* cited by examiner

METHOD OF MANUFACTURING WINDOW USING ION BEAM MILLING OF GLASS SUBSTRATE(S)

This application is a continuation-in-part (CIP) of each of: (a) U.S. patent application Ser. No. 10/074,685, filed Feb. 14, 2002, now U.S. Pat. No. 6,740,211, which claims priority on provisional No. 60/340,248, filed Dec. 18, 2001; (b) U.S. patent application Ser. No. 10/119,032, filed Apr. 10, 2002, now U.S. Pat. No. 6,592,993, which is a division of Ser. No. 09/927,507, filed Aug. 13, 2001 (now U.S. Pat. No. 6,395,333), which is a division of Ser. No. 09/442,805, filed Nov. 18, 1999 (now U.S. Pat. No. 6,338,901), which is a CIP of Ser. No. 09/303,548, filed May 3, 1999 (now U.S. Pat. No. 6,261,693); and (c) U.S. patent application Ser. No. 10/003,436, filed Dec. 6, 2001, which is a continuation of Ser. No. 09/703,709, filed Nov. 2, 2000 (now U.S. Pat. No. 6,368,664), which is a CIP of Ser. No. 09/657,132, filed Sep. 7, 2000 (now U.S. Pat. No. 6,277,480), which is a CIP of Ser. No. 09/627,441, filed Jul. 28, 2000 (now U.S. Pat. No. 6,280,834). All of the aforesaid applications and patents are hereby incorporated herein by reference.

CROSS-REFERENCES TO RELATED APPLICATIONS

This application is related to the aforesaid commonly owned applications/patents.

BACKGROUND OF THE INVENTION

Vehicle windshields typically include a pair of bent glass substrates laminated together via a polymer interlayer such as polyvinyl butyral (PVB). It is known that one of the two glass substrates may have a coating (e.g., low-E coating) sputtered thereon for solar control purposes such as reflecting IR and/or UV radiation, so that the vehicle interior can be more comfortable in certain weather conditions.

Conventional windshields are made as follows. First and second flat glass substrates are provided, one of them having a low-E coating sputtered thereon. The pair of glass substrates are washed and booked together (i.e., stacked on one another), and then while booked are heat bent together into the desired windshield shape at a high temperature(s) (e.g., 8 minutes at about 600–625 degrees C.). The two bent glass substrates are then laminated together via the polymer interlayer to form the vehicle windshield.

Unfortunately, yields for such windshields are often as low as 70% (i.e,. up to 30% may have to be thrown out). These rather low yields are caused by a number of factors, some of which are now described.

The glass substrates are typically made by the known float process which is very efficient and effective. During the glass making process, $SO_2$ is often used and tends to collect on the non-tin side of the glass. The presence of $SO_2$ deposits at the glass surface is not an immediate problem, but upon heat treatment (HT) at the high glass bending temperatures mentioned above the presence of this material can cause blemishes or imperfections (e.g., sometimes known as fish-eyes) to appear in the final vehicle windshield. Other undesirable surface deposits which can occur on the glass surface and which may ultimately cause significant blemishes or imperfections in a resulting windshield include: suction cup marks made during handling, grease pencil marks, glove marks, spray paint marks, scratch(es), thin film(s) of impurities, stains, oil/grease, fingerprints, and/or the like. Again, one or more of these undesirable deposits can result in windshield blemish(es) which may cause the windshield to have to be thrown away thereby resulting in low yields at a significant cost to the windshield manufacturer.

In view of the above, a need in the art exists for improving yields in vehicle windshield production and/or reducing the occurrence of significant blemishes in vehicle windshields (e.g. fish-eyes). It is an object of certain embodiments of this invention to fulfill one or more of these needs, and/or other needs which may become apparent to the skilled artisan from the description herein.

BRIEF SUMMARY OF THE INVENTION

An object of this invention is to provide a method of making vehicle windshields and/or other window products (e.g., IG window units or other types of vehicle or architectural windows) in an improved manner.

Another object of this invention is to provide a method of making a coated article, wherein a glass substrate is subjected to ion beam treating and/or milling prior to formation of a coating (e.g., sputter-coated coating) thereon.

Another object of this invention is to provide a method of making vehicle windshields and/or other windows in a manner so as to improve production yields and/or reduce the occurrence of significant blemish(es) or imperfections therein.

Another object of this invention is to, in a method of making a vehicle windshield or other window, ion beam treat and/or mill a surface of at least one of the glass substrates prior to coupling of the glass substrate to another substrate in order to remove certain undesirable surface deposits. Advantageously, such ion beam treating and/or milling has been found to improve yields and/or improve window quality.

Another object of certain embodiments of this invention is to ion beam treat and/or mill the glass substrate using (a) a gas comprising fluorine (F), and/or (b) a gas including a combination of argon and oxygen ($Ar/O_2$). Surprisingly, it has been found that F inclusive and/or $Ar/O_2$ inclusive gas used at the ion beam source in the glass treating and/or milling process results in faster and/or more efficient removal of contaminants from the glass surface. Moreover, in embodiments where oxygen gas is used, it seems to be beneficial in reducing the amount of iron that is sputtered by the beam—especially during the cleaning process. The oxygen lightly passivates the surface(s) of the source electrode (s) resulting in a thin oxide film. Since the sputter etch rate for FeO is lower than iron, less electrode erosion is enabled by the use of the oxygen and the resulting oxide film (i.e., the electrode(s) last longer).

Another object of certain example embodiments of this invention is to ion beam treat and/or mill a glass substrate using an ion beam that is diffused, as opposed to focused or collimated.

Another object of this invention is to fulfill one or more of the above-listed objects and/or needs.

Generally speaking, certain example embodiments of this invention fulfill one or more of the above listed objects and/or needs by providing a method of making a window including at least one glass substrate, the method comprising: providing a first glass substrate; ion beam treating a surface of the first glass substrate with an ion beam comprising at least fluorine (F) ions thereby forming an ion beam treated surface of the first glass substrate; and following said ion beam treating, sputtering a coating including at least one infrared (IR) reflecting layer on the ion beam treated surface of the first glass substrate. The ion beam treating may or may not comprise ion beam milling the surface of the first glass substrate so as to remove at least 2 Å of glass from at least a portion thereof and form an ion beam milled surface of the first glass substrate in certain embodiments of the invention.

In certain other example embodiments of this invention, at least one of the aforesaid objects is satisfied by providing a method of making a window comprising: providing a first glass substrate; ion beam milling a surface of the first glass substrate with an ion beam comprising at least argon and oxygen ions so as to remove at least 2 Å of glass from at least a portion of the first glass substrate thereby forming an ion beam milled surface of the first glass substrate; and following said ion beam milling, sputtering a coating including at least one infrared (IR) reflecting layer on the ion beam milled surface of the first glass substrate.

In certain other example embodiments of this invention, at least one of the aforesaid objects is satisfied by providing method of making a window, the method comprising: providing first and second glass substrates; ion beam milling at least one surface of the first glass substrate using an ion beam comprising argon and fluorine ions so as to remove at least 2 Å of glass from at least a portion of the first glass substrate and form an ion beam milled surface of the first glass substrate, forming a coating on the ion beam milled surface of the first substrate; and coupling the first glass substrate with the coating thereon to the second glass substrate so that the coating is provided between the first and second glass substrates.

In certain other example embodiments of this invention, at least one of the aforesaid objects is satisfied by providing a window comprising at least one glass substrate, comprising: the glass substrate supporting a coating, wherein the coating includes at least one IR reflecting layer provided between at least first and second dielectric layers; and wherein a surface area of the glass substrate on which the coating is provided is doped with F.

DETAILED DESCRIPTION OF EXAMPLE EMBODIMENTS OF THE INVENTION

Figure 1:
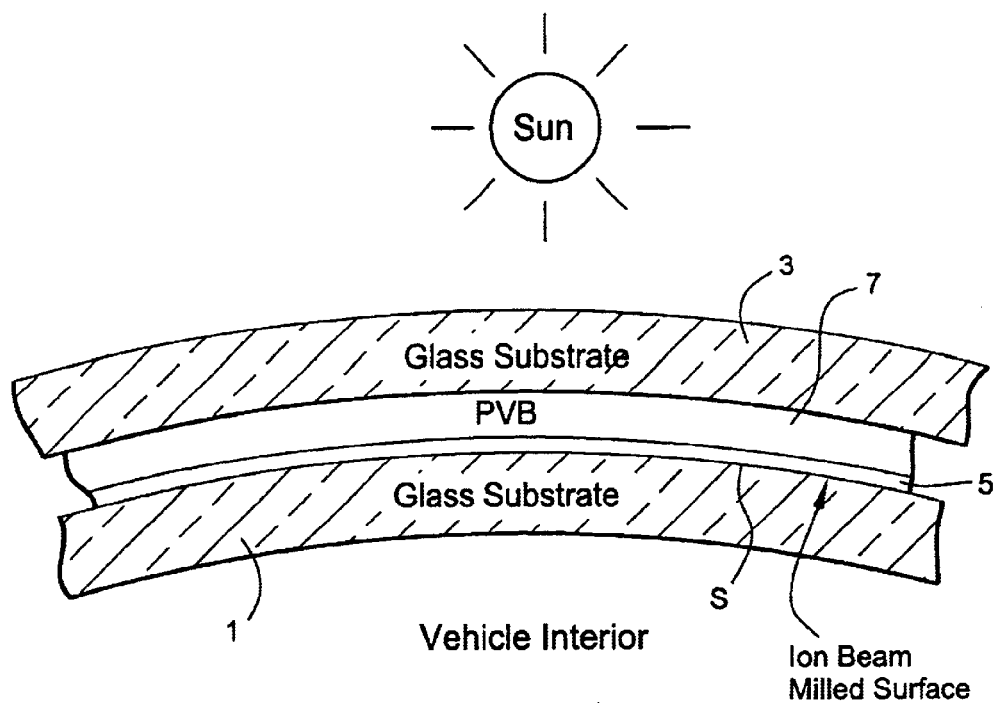
FIG. 1 is a cross sectional view of a vehicle windshield according to an embodiment of this invention.

Referring now more particularly to the accompanying drawings in which like reference numerals indicate like parts/steps through the several views.

Certain example embodiments of this invention relate to a method of making a vehicle windshield or other laminated window. In certain embodiments, one or both of the glass substrates is ion beam treated and/or milled (i.e., milling means removing at least some of the glass from the substrate surface) prior to lamination. This ion beam treating and/or milling has been found to reduce the likelihood of significant blemishes in final products, thereby improving yields, presumably because the ion beam treating and/or milling acts to remove certain undesirable surface deposits that were present on the glass surface prior to the treating/milling (e.g., $SO_2$, suction cup marks, grease pencil marks, stains, glove marks, spray paint marks, scratches, fingerprints, and/or the like). By removing such undesirable deposits from the glass surface prior to heat treatment (e.g., heat bending and/or thermal tempering), blemishes and/or defects arising from such deposits can be reduced and/or eliminated in the final product. The embodiments described herein are provided for purposes of example only, and are not intended to be limiting unless specifically claimed.

Raw defects such as cutting oil, suction cup marks, or G-cor oil are problematic as discussed above, but may often be picked up by optical robot detector(s) and are not as problematic as the more difficult to detect soft defects (e.g., thin films of impurities). It has been found that the ion beam treating and/or milling of the instant invention is good at reducing or eliminating these tough to detect soft defects (as well as the raw defects in some instances), thereby improving yields of the resulting products (e.g., vehicle windshields).

It has surprisingly been found that ion beam treating and/or milling the glass substrate(s) using: (a) a gas comprising fluorine (F), and/or (b) a gas including a combination of argon and oxygen ($Ar/O_2$) provides for certain advantage(s) over the prior art. It has been found that F inclusive and/or $Ar/O_2$ inclusive gas(es) used at the ion source, thereby resulting in F and/or Ar/O ions in the ion beam, results in faster and/or more efficient removal of contaminants from the glass surface.

Moreover, in embodiments where oxygen gas is used (e.g., in combination with an inert gas such as Ar), it seems to be beneficial in reducing the amount of iron that is sputtered by the beam—especially during the cleaning process. The oxygen lightly passivates the surface(s) of the source electrode(s) (anode and/or cathode) resulting in a thin oxide film being formed on the electrode(s) surface. Since the sputter etch rate for FeO is lower than iron, less electrode erosion is enabled by the use of the oxygen and the resulting oxide film (e.g., iron oxide film on the cathode) formed therefrom (i.e., the electrode(s) last longer). Thus, less iron is sputtered from the ion beam source electrode(s) so that less iron tends to contaminate the substrate being etched, or coatings applied thereto. In some cases, it has been found that the introduction of oxygen gas into the source substantially reduces the amount of elemental iron found throughout film(s) formed on the substrate, in certain instances only ⅕ the amount of iron is in the film compared to if pure Ar gas (and no oxygen) was used during milling.

FIG. 1 is a side cross sectional view of a vehicle windshield according to an example embodiment of this invention. The windshield includes first and second bent glass substrates 1 and 3, respectively, a coating (e.g., low-E coating) 5 provided on interior glass substrate 1, and a polymer based interlayer 7 (e.g., including PVB (polyvinyl butyral) or any other suitable polymer interlayer material) for laminating the two substrates together as illustrated. In this particular embodiment, it can be seen that coating 5 is provided on the interior glass substrate 1 which is adjacent to the vehicle interior; and coating 5 is located so as to face the interlayer 7 and the opposing substrate 3 so that the coating 5 is between the two substrates 1 and 3.

Substrates 1 and 3 are preferably glass (e.g., soda lime silica glass) made via any suitable process (e.g., float process). The glass substrates 1 and 3 may be clear or colored (e.g., green, grey, blue, etc.) in different embodiments of this invention. While the glass substrates/sheets 1 and 3 are illustrated as being bent in the FIG. 1 embodiment, it is recognized that they may instead be flat in other embodiments of this invention where flat windshields or flat windows are desired. While glass is preferred for substrates 1, 3, other materials such as plastic may be used for one or both of the substrates in alternative embodiments.

When substrates 1 and/or 3 are of soda lime silica glass, they have significant amounts of sodium (Na) therein which can lead to stains and/or corrosion, e.g., when Na at the glass surface reacts with the outside atmosphere for example. An example composition of the glass substrates 1 and/or 3 is set forth below. An exemplary soda-lime-silica base glass according to certain embodiments of this invention, on a weight percentage basis, includes the following basic ingredients:

TABLE 1

Example Base Glass for Substrates 1 and/or 3

| INGREDIENT | Wt. % |
|---|---|
| $SiO_2$ | 67–75% |
| $Na_2O$ | 10–20% |
| CaO | 5–15% |
| MgO | 0–6% |
| $Al_2O_3$ | 0–5% |
| $K_2O$ | 0–5% |

Other minor ingredients, including various conventional and refining aids, such as $SO_3$, carbon, gypsum, $CaSO_4$ and the like may also be included in the base glass. In certain embodiments, for example, glass herein may be made from batch raw materials silica sand, soda ash (or NaOH as a soda source), dolomite, limestone, with the use of salt cake ($SO_3$) and/or Epsom salts (e.g., about a 1:1 combination of both) as refining agents. Reducing agent(s) such as Si (metallic), Si, silicon monoxide, SiO, sucrose, and/or carbon may also be used. Moreover, one or more colorants (e.g., Fe, Co, Se, and/or the like) may also be used in the glass in different embodiments of this invention.

Polymer inclusive or polymer based interlayer 7 may include or be of PVB in certain embodiments of this invention, or alternatively may be of or include any other suitable polymer inclusive interlayer material in other embodiments of this invention.

Coating 5 may be any suitable solar control coating, including but not limited to any suitable low-emissivity (low-E) coating that blocks (i.e., reflects and/or absorbs) infrared (IR) and/or ultraviolet (UV) radiation. For example, and without limitation, low-E coating 5 may be or comprise any of the coatings described and/or illustrated in any of U.S. Pat. Nos. 5,557,462, 5,770,321, 5,514,476, 5,376,455, 6,132,881, 6,059,909, 4,898,789, 4,413,877, or 3,682,528, all of which are hereby incorporated herein by reference. Alternatively, coating 5 may be or comprise any of the coatings described or illustrated in any of U.S. patent application Ser. Nos. 09/794,224, 09/778,949, 09/793,406, or 09/797,903, all of which are hereby incorporated herein by reference. In still further alternative embodiments of this invention, any other solar control coating may be used as coating 5. While coating 5 is illustrated as being on the surface of only substrate 1 in the FIG. 1 embodiment, those skilled in the art will recognize that another coating 5 could also be provided on the interior surface of the other substrate 3 adjacent the PVB layer 7.

In certain embodiments of this invention, it has been found that ion beam treating and/or milling of substantially the entire surface S of substrate 1 prior to sputter deposition of coating 5 thereon, and thus prior to heat treatment and lamination, enables reduction and/or elimination of certain blemishes and/or defects in the final product, and/or can reduce undesirable haze in the final product. As will be described in more detail below, impingement of an ion beam from an ion beam source(s) on the surface S of substrate 1 in milling embodiments causes a certain portion of the glass at the substrate surface to be milled off (i.e., removed). The amount of glass removed from substrate 1 during the ion beam milling is a function of, for example, the ion energy used, angle of incidence of the ion beam on the substrate surface S, the speed that the substrate passed under the ion beam, the feedstock gas(es) used in the ion beam source, the type of ion beam source used, and/or the type of glass being milled.

The ion beam used for the treating and/or milling of the substrate may be focused, collimated, or diffused in different embodiments of this invention, although a diffused beam may be preferred in certain instances. Surprisingly, it has been found that using a diffused ion beam (as opposed to a focused or collimated ion beam) results in improved treating and/or milling of the glass substrate in certain example embodiments of this invention. In particular, it has been found that using a diffused ion beam source enables much quicker ion beam milling of material off of a glass substrate than does using a collimated or focused ion beam. This advantage is especially true when in a diffused mode of operation, the ion beam includes not only inert gas ions (e.g., Ar+ and/or Xe), but also reactive ions (e.g., O, N and/or F ions). This is because when inert gas ions are physically milling off material from the glass substrate 1, the reactive ions (atomic and/or molecular) are reacting with material at the surface of the glass substrate and etching the same in order to further contribute to the milling process. Moreover, it has surprisingly been found that the collision frequency in a diffused mode of operation may be higher than in a collimated mode even though the ion energy may be less and with a broader distribution. Furthermore, the diffused nature of the ion beam in diffused modes of ion beam treating/ milling allows the plasma to wrap around material to be removed from the substrate surface thereby enabling them to be more easily removed (e.g., via reactive milling)—in contrast to a collimated beam which has more difficulty reach many sides of material to be milled.

Diffused ion beams are also less dependent upon the angle of incidence of the beam on the substrate. In particular, collimated ion beams are much more efficient when they hit the substrate surface at an angle other than 90 degrees (e.g., see angle θ in FIG. 9). However, diffused ion beams are not as dependent upon severe angles of incidence, and can be efficiently used at a broader range of angles including 90 degrees (although diffused ion beams function better when they are closer to the substrate to be milled or treated).

An example set-up for an ion source to generate a diffused beam is as follows when using a closed drift linear ion beam source: Electric Gap: 2 mm; Magnetic Gap: 3 mm; Voltage: 0.5 to 5.0 kV, Current: 5–10 A; Power 4100 kW, Working Pressure: $2-5 \times 10^{-3}$ Torr; Gas Flow: 50–80 sccm Ar, 150–200 sccm O, 100–150 sccm N; Carrier Speed Range: 1–5 m/min; Throw Distance: 3–5 (preferably 4) inches. According to another example set-up for an ion source to generate a diffused beam, voltage and gas flow parameters are as follows: Voltage: 3 kV; 150 sccm Ar; 50 sccm oxygen. The aforesaid parameters are provided for purpose of example only and are not intended to be limiting, and they may be varied as a function of the application.

In certain example embodiments of this invention, it has surprisingly been found that ion beam treating and/or milling using certain gas(es) works better than ion beam milling with other gas(es). For example, it has been found that ion beam treating and/or milling with both F inclusive gas and/or a combination of $Ar/O_2$ gas provides certain advantage(s) over the prior art. It has been found that F inclusive and/or $Ar/O_2$ inclusive gas used at the ion beam source in the glass treating/milling process results in faster and/or more efficient removal of contaminants from the glass surface. This is an advantage over a conventional sputter-etching technique where simply Ar gas is used at the ion beam source (e.g., see U.S. Pat. No. 5,888,593 which in column 14, line 47, discussed sputter etching using Ar).

In the case of F inclusive gas(es), the gas is introduced into the ion beam source in a know manner. In the plasma generated by the ion beam source, free F molecules and F radicals (e.g., $F^-$) are generated. These (especially the F radicals) are very reactive, so that formation of the F radicals tends to increase the reactivity of the overall F inclusive gas(es). The F radicals formed at the ion source and which are directed toward the substrate in the ion beam tend to strongly react with certain materials such as those present in certain contaminants on the glass surface. Example F inclusive gases which may be used to ion beam treat and/or mill a substrate herein include $CF_4$, $NF_3$, and/or any other suitable gas(es) including F including but not limited to F-inclusive refrigerant gases such as freon. One or more F inclusive gases may be used at the same time during the ion beam milling process, and may also be used in combination with other gas(es) that do not include F.

When the F ions in the ion beam are directed toward the glass substrate 1 to be treated and/or milled (note: the term "treat" (or "treating") may or may not include removal of glass from the substrate; whereas the term "mill" (or "milling") includes removal of glass from the substrate), the F ions react with certain undesirable elements at or near the glass surface thereby enabling improved cleaning and/or milling of the surface. For example, the F in the ion beam tends to quickly react with free Na present at or near the glass surface. Na at the glass surface is often undesirable since it can lead to corrosion in the ultimate coated glass product. However, when ion beam treating and/or milling with F inclusive gas is used, the F acts to reduce Na present at or near the glass surface thereby reducing the amount of free Na at the substrate surface which could ultimately lead to corrosion. When the F reacts with certain contaminants at the glass surface, the result may be a gas which exits the glass surface. The presence of F ions in the ion beam may also lead to faster milling of the glass substrate in some embodiments, as the F ions may react with Si of the glass to form a gas(es) such as $SiF_4$. Yet another optional possible advantage of providing F ions in the ion beam is that the refractive index "n" of the glass surface may be lowered, thereby lowering the reflectance of the glass.

Moreover, certain F ions and/or molecules may subimplant into the glass surface during the ion beam treating and/or milling process thereby doping the glass surface area with F. The subimplanted F may function to prevent and/or reduce the amount of Na that can migrate to the glass surface in the future, even after the coating has been applied to the milled glass surface. In other words, the ion beam may cause F to subimplant into the glass surface thereby causing the glass substrate 1 to be doped with F at or near a surface thereof. In this respect, much if not all of the F doping of the substrate tends to be within the outermost 20 Å of the glass substrate 1. There may or may not be any F present in the glass substrate in areas other than at the 20 Å thick surface area.

Because of the F subimplantation into the glass, there is more F present in the surface area of the glass substrate than at other areas of the glass substrate. The presence of F at or near the glass surface is especially beneficial when the glass needs to be heat treated (e.g., tempered and/or heat-bent). This is because heat treatment tends to cause Na to migrate to the glass surface. However, if F is present at or near the glass surface when the heat treatment is performed, this undesirable Na migration to the glass surface can be reduced thereby leading to a longer-lasting product.

While the treatment of the glass surface using an ion beam including at least F ions may be used in the context of ion beam milling, certain embodiments of this invention are not so limited. The treatment of a glass surface herein using F ions (e.g., for F subimplantation and/or cleaning purposes) in an ion beam may be carried out regardless of whether the surface is also milled.

In the case of using an $Ar/O_2$ gas combination at the ion beam source, this also in an improvement. The Ar ions in the ion beam (resulting from the Ar gas) may act to mill the glass substrate when directed thereat in the ion beam. The oxygen will also ionize in the plasma, with the resulting oxygen ions being both energetic and reactive. When the oxygen ions reach the glass surface in the ion beam, they tend to react with certain contaminants at the glass surface in order to form gas(es) such as CO and/or $CO_2$ which quickly exit the glass surface thereby removing contaminants. In other words, a primary purposes of the Ar ions is to mill or remove the glass from the substrate surface, while a primary purpose of the O ions is to enable improved cleaning at the substrate surface. Alternatively, N inclusive gas could be used along with argon/oxygen combination, or in still further optional embodiments in place of the oxygen. Accordingly, it has been found that using a combination of argon/oxygen, argon/oxygen/nitrogen, or argon/nitrogen gas results in more efficient milling/cleaning of the glass surface.

The concepts of (i) using F inclusive gas, and (ii) using argon/oxygen and possibly nitrogen gas, may be used separately and independently from one another in certain embodiments of this invention. For example, the ion beam source may utilize a F inclusive gas(es), but not Ar (although other gas(es) may also be used along with the F inclusive gas(es)), in certain embodiments of this invention. In another example embodiments, a combination of argon/oxygen inclusive gas may be used at the ion source, without the presence of a F inclusive gas. However, in certain embodiments of this invention, the concepts (i) and (ii) may be used in combination. Thus, in certain embodiments of this invention, both a F inclusive gas(es) and a mixture of argon/oxygen gas(es) may be present at the ion beam source in order to help form the ion beam that is used for treating and/or milling the substrate surface. In still further embodiments, both a F inclusive gas(es) and an Ar inclusive gas may be present at the ion beam source (with or without other gases such as oxygen and nitrogen) in order to help form the ion beam that is used for treating and/or milling the substrate surface Good results in milling embodiments (i.e., good reduction in defects and/or reduction of haze) may occur when the ion beam milling: removes at least about 2 Å of glass from surface S of substrate 1, more preferably removes at least about 5 Å of glass from surface S of substrate 1, even more preferably removes from about 5–500 Å of glass from surface S of substrate 1, still more preferably from about 10–100 Å of glass from surface S of substrate 1, and most preferably from about 20–80 Å of glass from surface S of substrate 1.

Glass substrates 1 and/or 3 may be made via the known float process in which a tin bath is utilized. It will thus be appreciated by those skilled in the art that as a result of forming the glass substrates 1 and/or 3 on molten tin in certain exemplary embodiments, small amounts of tin or tin oxide may migrate into surface areas of the glass on the side of the glass that was in contact with the tin bath during manufacture (i.e., typically, float glass may have a tin oxide concentration of 0.05% or more (wt.) in the first few microns below the surface that was in contact with the tin bath). In this regard, in certain example non-limiting embodiments of this invention, surface S of substrate 1 which is ion beam milled is the non-tin side/surface of the substrate 1 (i.e., the tin side of substrate 1 is adjacent/in the vehicle interior and faces away from the polymer based interlayer 7 in the FIG. 1 embodiment).

While FIG. 1 illustrates only the non-tin surface S of substrate 1 being ion beam treated and/or milled, it will be recognized that other ion beam treating and/or milling may be carried out in other embodiments of this invention. For example, in certain embodiments of this invention, both surface S of substrate 1 and the surface of substrate 3 facing layer 7 may be ion beam treated and/or milled as described herein. In other embodiments of this invention, both surface S of substrate 1 and the exterior surface of substrate 3 may be ion beam treated and/or milled as described herein. Optionally, the tin-side surface of substrate 1 (i.e., which faces the vehicle interior in the FIG. 1 embodiment) may also be ion beam treated and/or milled.

Figure 2:
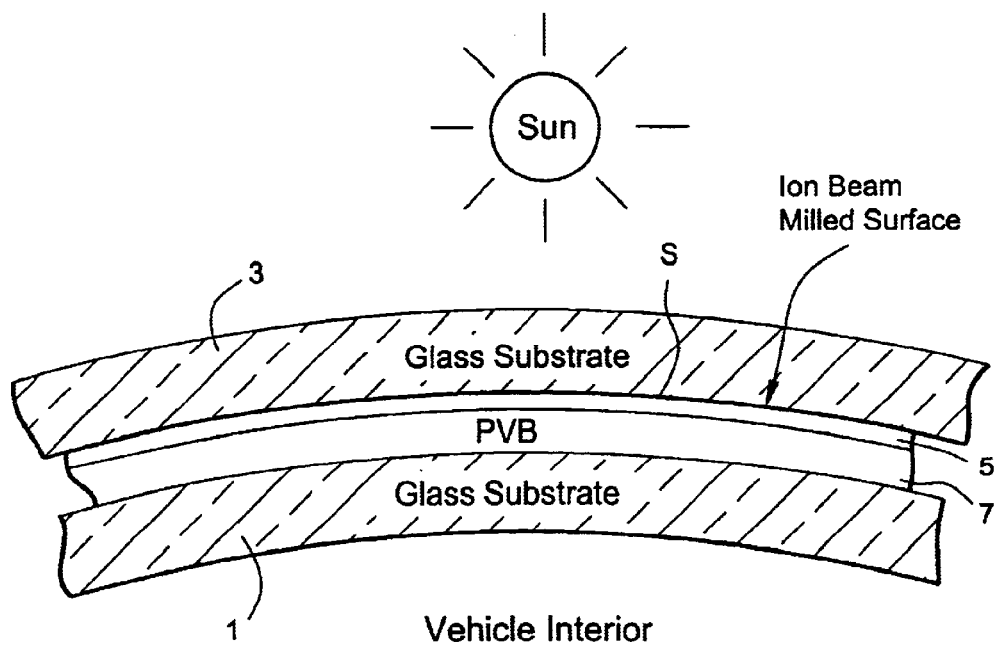
FIG. 2 is a cross sectional view of a vehicle windshield according to another embodiment of this invention.

FIG. 2 is a side cross sectional view of a vehicle windshield according to another embodiment of this invention. The FIG. 2 embodiment is similar to the FIG. 1 embodiment described above, except that the coating 5 is provided on the exterior glass substrate 3 instead of on the interior substrate 1. Thus, in this embodiment, the ion beam treating and/or milling is performed on the non-tin side surface S of substrate 3 on which coating 5 is to be sputtered or otherwise deposited.

Figure 3:
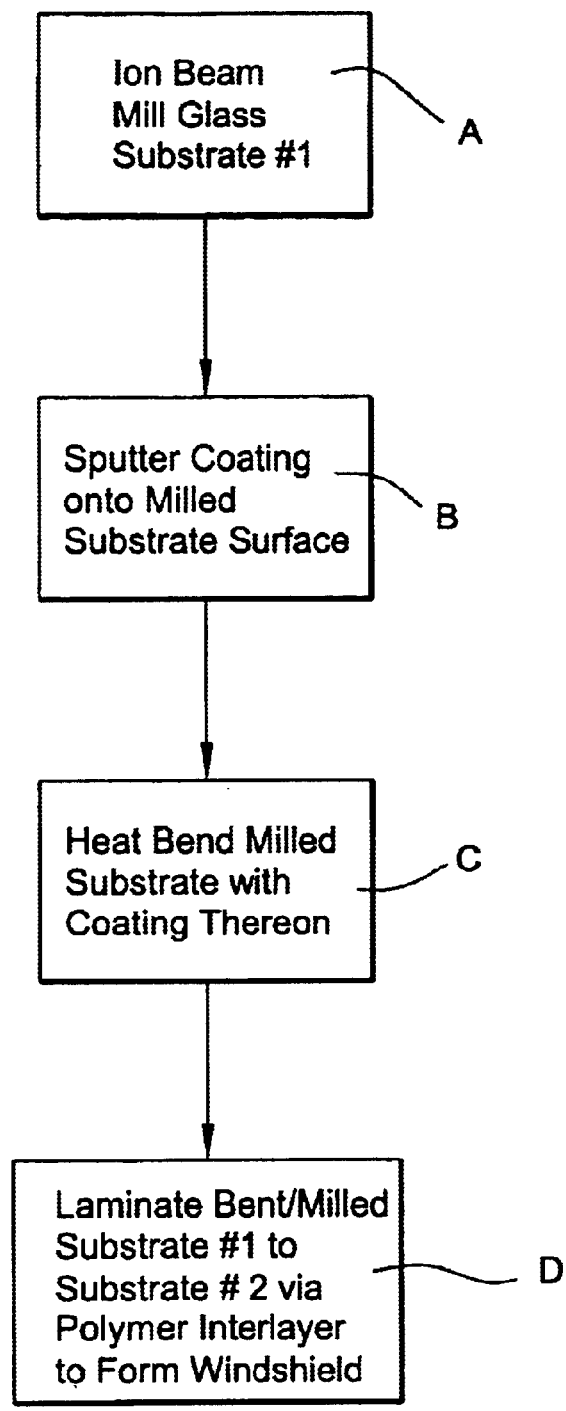
FIG. 3 is a flowchart illustrating certain steps carried out in making a vehicle windshield according to any embodiment herein.

FIG. 3 is a flowchart illustrating steps taken in making a vehicle windshield (or other laminated window) according to either the FIG. 1 or FIG. 2 embodiment(s) of this invention. In step A, a first glass substrate (flat or bent) is ion beam treated and/or milled (e.g., in the FIG. 1 embodiment at least surface S of substrate 1 is treated and/or milled; while in the FIG. 2 embodiment at least surface S of substrate 3 is treated and/or milled in this step). Thereafter, in step B a coating 5 is deposited (e.g., sputtered) onto the ion beam milled surface S of the first glass substrate. Then, in step C the ion beam treated and/or milled and coated substrate is heat treated and bent into the desired windshield shape (either alone or together with another substrate). During such heat bending, the glass substrate(s) are heated to temperature(s) of from 570–900 degrees C., more preferably from 580–800 degrees C., for at least 2 minutes, more preferably for at least 5 minutes, so as to enable glass bending and/or tempering. After the ion beam treated/milled and coated glass substrate has been heat bent, in step D it is laminated to another heat bent glass substrate via a polymer based interlayer (e.g., PVB inclusive layer 7) to form the resulting vehicle windshield.

Figure 4:
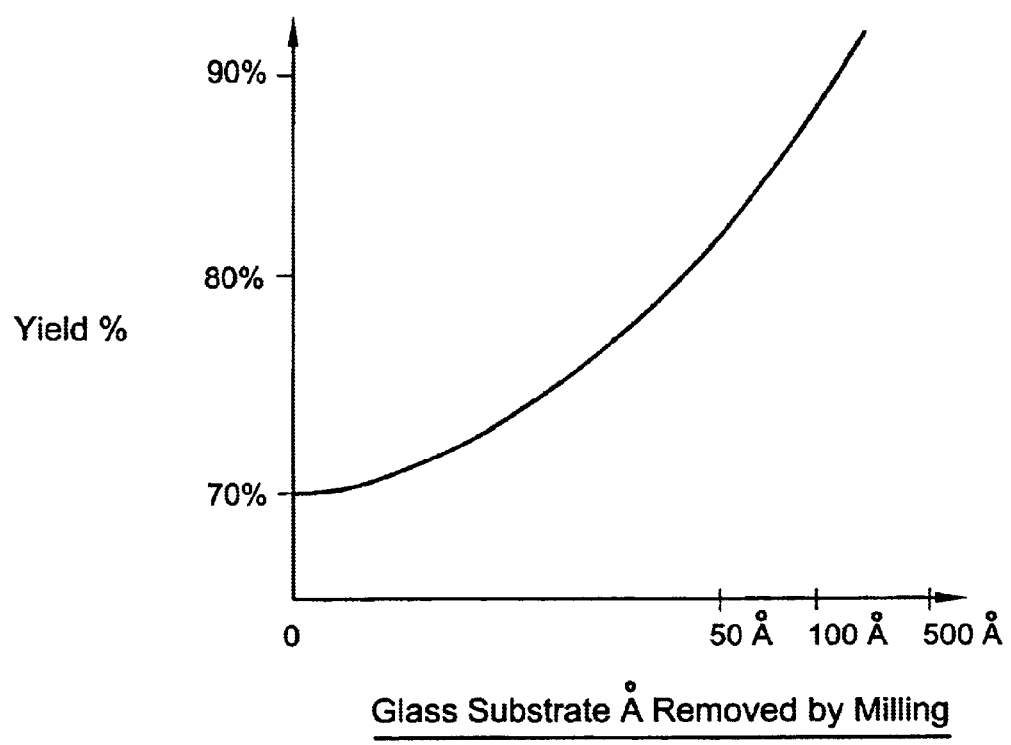
FIG. 4 is a graph (thickness of glass substrate removed by ion beam milling vs. windshield yield %) illustrating that ion beam milling improves yields according to certain example embodiments of this invention.

FIG. 4 is a graph illustrating that ion beam milling of surface S of a substrate (according to either the FIG. 1 or FIG. 2 embodiment(s)) improves the yield % of the resulting vehicle windshield given a know standard of acceptance. As can be seen, even a small amount of ion beam milling removes sufficient undesirable deposits to improve yield to some extent, while additional milling (e.g., from 50–100 Å) significantly improves yield by further reducing the likelihood of product defects/blemishes.

Figure 5:
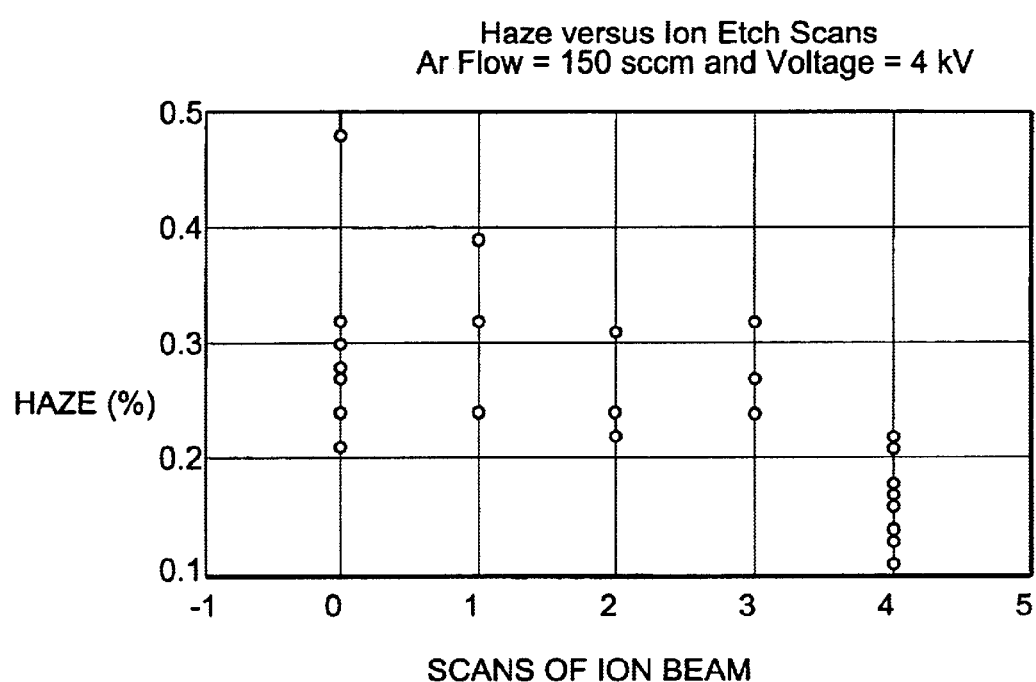
FIG. 5 is a graph (ion beam scans vs. haze %) illustrating that ion beam milling reduces haze in resulting windshields in certain example embodiments of this invention.

FIG. 5 is a graph illustrating that, surprisingly, certain amounts of ion beam milling of surface S of a substrate reduces the occurrence of undesirable haze in the final windshield product. For the examples making up FIG. 5, 150 sccm Ar feedstock gas was used in the ion beam source at a pressure of 2.25 mTorr (four vacuum pumps operating), a 4015 V potential was applied to the anode to achieve discharge current of 1.782 A, the glass substrate was moved at a linear velocity of 100 inches/minute beneath the ion beam source, and the ion beam was incident on the substrate at an angle θ of 45 degrees. The samples were exposed to different numbers of ion beam milling passes to see the results of different amounts of ion beam milling upon haze reduction. After milling, a titanium oxide coating was applied to the milled substrate. As shown in FIG. 5, the samples exposed to four ion beam passes for milling had much less haze than the samples not ion beam milled. Freshly produced glass typically has a haze value of 0.05 to 0.08%, while long-time stored glass can have haze values of 2–10%. Thus, ion beam milling a surface of a glass substrate (tin side and/or non-tin side) can be used to reduce haze (e.g., to the values shown in FIG. 5). The use of ion beam milling according to certain embodiments of this invention may be used in combination with the FIGS. 1–2 embodiments herein, or separate and independent thereof in other glass window applications.

With respect to haze, in certain embodiments of this invention, ion beam milling is performed on a glass substrate surface (see milling amounts above with respect to glass removed) in order to reduce haze by at least 10%, more preferably so as to reduce haze by at least 20%, and even more preferably to reduce haze by at least 50%.

Figure 6:
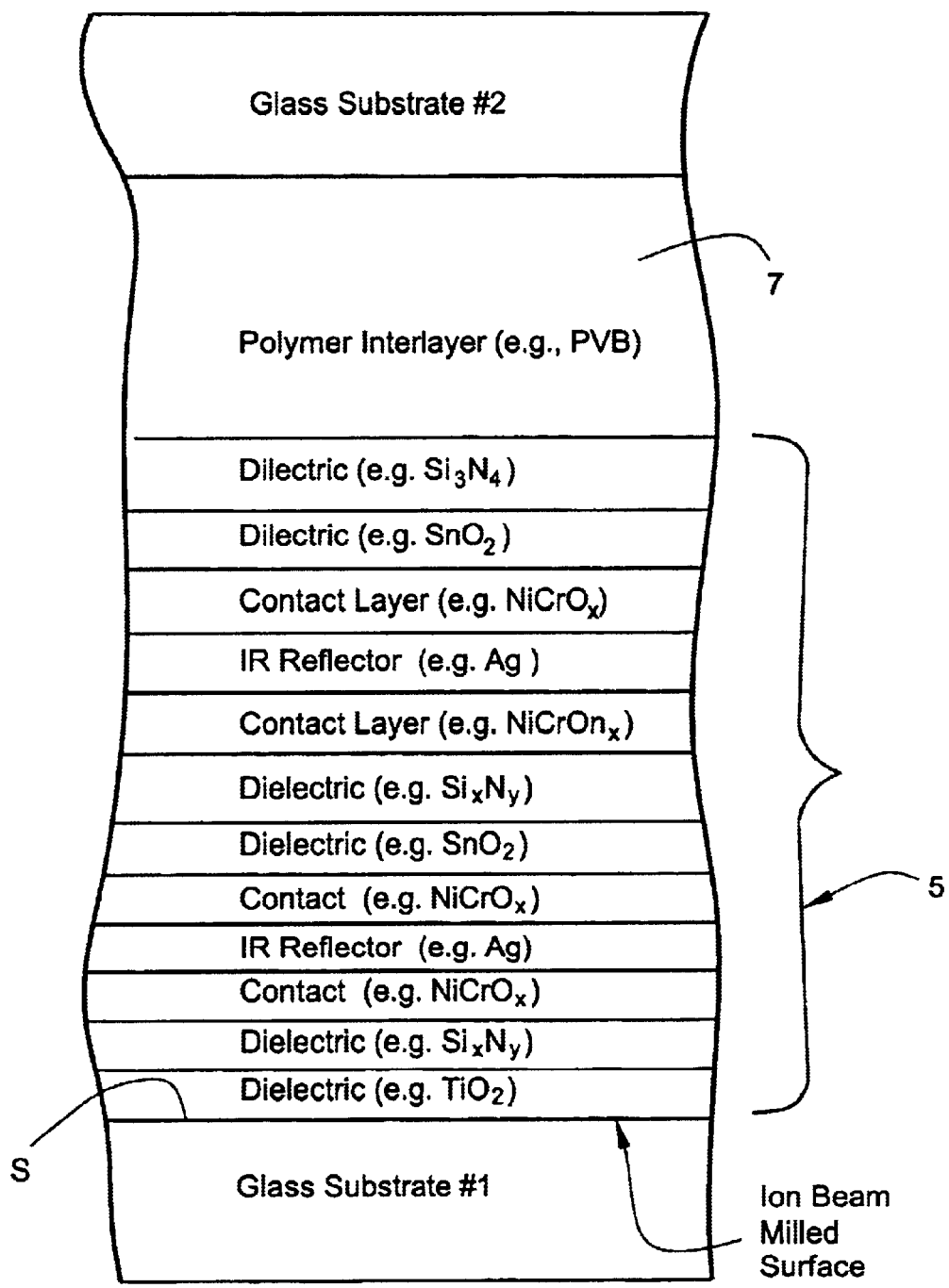
FIG. 6 is a cross sectional view of a vehicle windshield or other window according to an example embodiment of this invention.

While many different types of coatings 5 may be used in either of the FIG. 1 or FIG. 2 embodiments of this invention, FIG. 6 illustrates an example of one such coating. As illustrated, the multi-layer coating 5, including multiple IR reflecting Ag layers, is provided on the first substrate (either substrate 1 or 3) over the ion beam treated and/or milled surface S thereof. The treated/milled and coated substrate is then laminated to the other substrate (the other of 1 or 3) via polymer based interlayer 7. The low-E coating 5 of the FIG. 6 embodiment includes, from the glass substrate #1 outwardly, the following layers:

TABLE 1

(Example Coating Materials/Thicknesses; FIG. 6 Embodiment)

| Layer | Preferred Range (Å) | More Preferred (Å) | Example (Å) |
|---|---|---|---|
| $TiO_2$ | 0–400 Å | 50–250 Å | 100 Å |
| $Si_xN_y$ | 0–400 Å | 50–250 Å | 170 Å |
| $NiCrO_x$ | 5–100 Å | 10–50 Å | 18 Å |
| Ag | 50–250 Å | 80–120 Å | 105 Å |
| $NiCrO_x$ | 5–100 Å | 10–50 Å | 16 Å |
| $SnO_2$ | 0–800 Å | 500–850 Å | 650 Å |
| $Si_xN_y$ | 0–800 Å | 50–250 Å | 170 Å |
| $NiCrO_x$ | 5–100 Å | 10–50 Å | 18 Å |
| Ag | 50–250 Å | 80–120 Å | 105 Å |
| $NiCrO_x$ | 5–100 Å | 10–50 Å | 16 Å |
| $SnO_2$ | 0–500 Å | 100–300 Å | 150 Å |
| $Si_3N_4$ | 0–500 Å | 100–300 Å | 250 Å |

In certain example embodiments of this invention, whether the FIG. 6 coating 5 listed above, or some other coating is provided on the treated and/or milled substrate, resulting vehicle windshields may be characterized by one or more of the following parameters (as with other characteristics herein, these are non-limiting herein, unless specifically claimed):

TABLE 2

Example Color/Transmission After HT (Laminated)

| Characteristic | General | More Preferred |
|---|---|---|
| $T_{vis}$ (Ill. A, 2 deg.): | >= 70% | >= 75% |
| $T_{vis}$ (Ill. C, 2 deg.): | >= 70% | >= 75% |
| $R_gY$ (Ill. A, C; 2 deg.): | <= 15% | <= 11% |
| $a^*_g$ (Ill. A, C; 2°): | –4.0 to +4.0 | –1.0 to +1.0 |
| $b^*_g$ (Ill. A, C; 2°): | –10.0 to +8.0 | –8.0 to –2.0 |
| $R_fY$ (Ill. A, C; 2 deg.): | <= 15% | <= 11% |
| $a^*_f$ (Ill. A, C; 2°): | –6.0 to +6.0 | –2.0 to +2.0 |
| $b^*_f$ (Ill. A, C; 2°): | –5.0 to +5.0 | –4.0 to +3.0 |
| $R_{solar}$: | >= 24% | >= 28% |
| Haze: | <= 0.4 | <= 0.3 |
| $T_{solar}$: | <= 52% | <= 48% |

Figure 7:
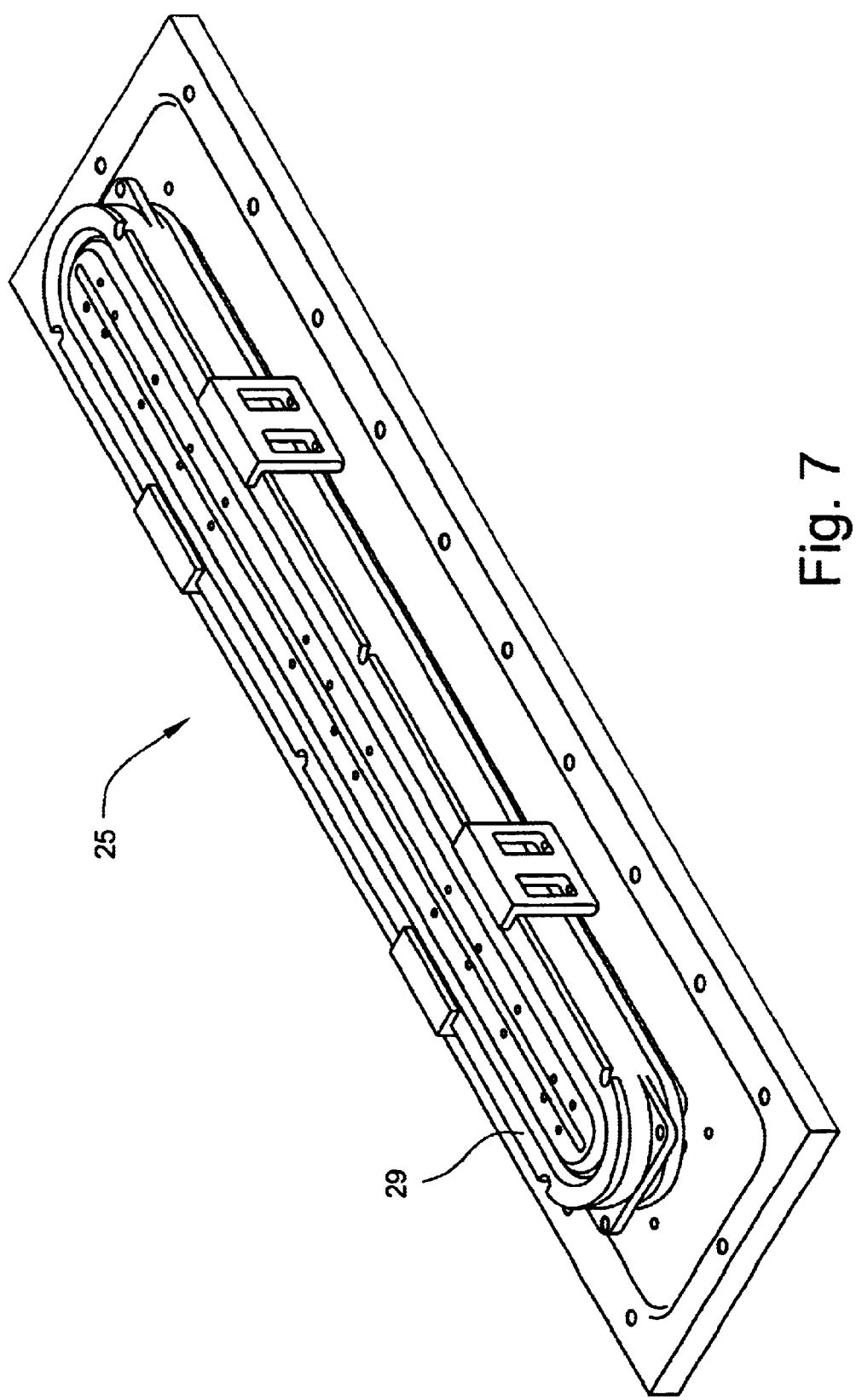
FIG. 7 is a perspective view of an ion beam source which may be used in milling according to an example embodiment of this invention.
Figure 8:
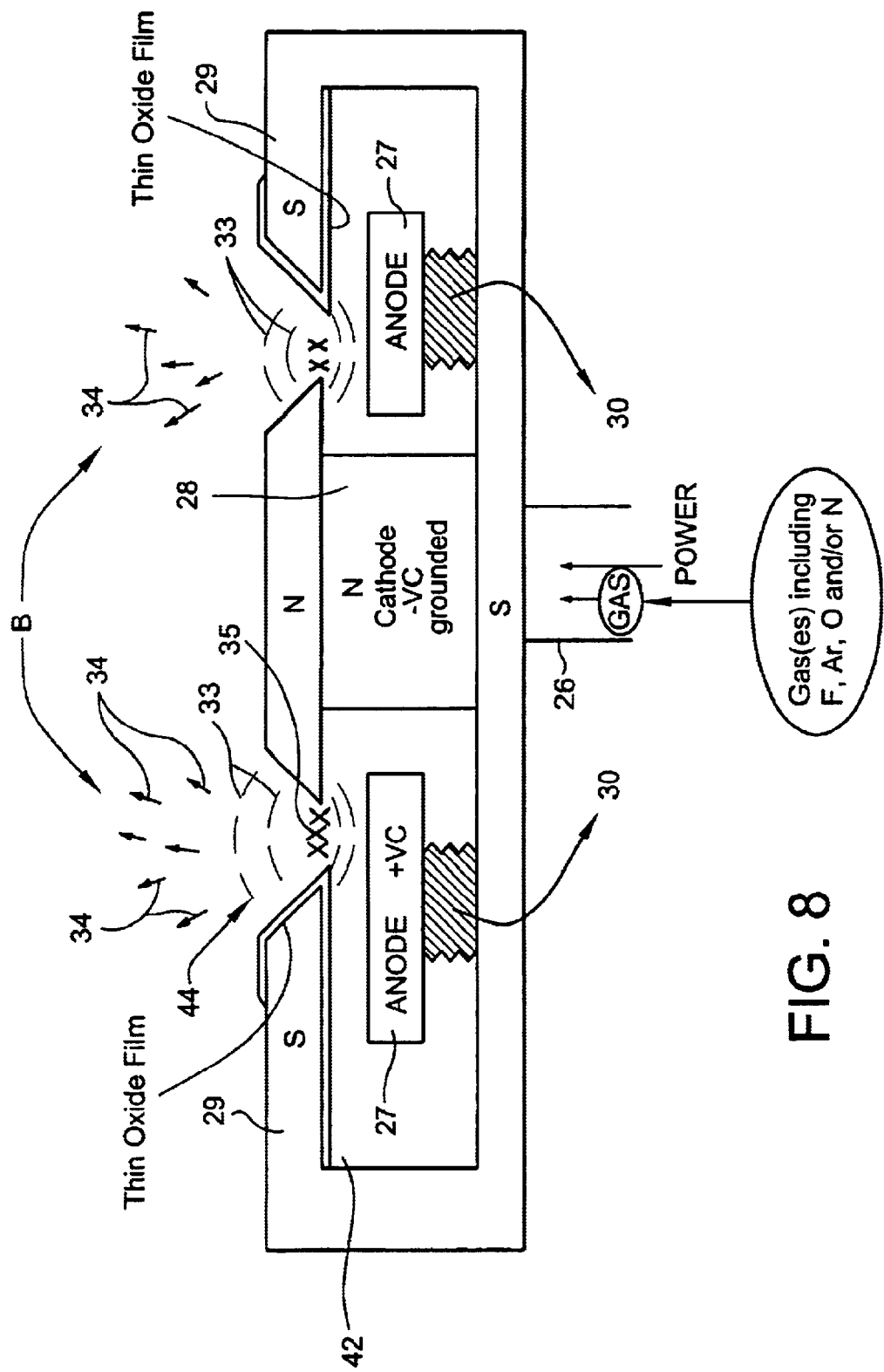
FIG. 8 is a cross sectional view of the ion beam source of FIG. 7.

FIGS. 7–8 illustrate an example linear ion beam source 25 which may be used to ion beam treat and/or mill a glass substrate(s) 1 and/or 3 herein. One or more sources 25 may be used in different embodiments of this invention, depending upon the application. For example, when much treating/milling is desired, the glass substrate to be milled may be successively passed under two or more different ion beam sources 25 which are in-line with one another. In alternative embodiments of this invention, only a single source 25 need be used. Ion beam source 25 includes gas/power inlet 26, anode 27, grounded cathode magnet portion 28, magnet poles 29, and insulators 30. A 3 kV (or 5 kV or more) DC and/or AC power supply may be used for source 25 in some embodiments. The ion beam B from the source may be focused or non-focused (e.g., diffused) in different embodiments of this invention. Ion beam source 25 is based upon a known gridless ion source design. In embodiments where oxygen gas is used during milling, an example thin oxide film (e.g., iron oxide film) is illustrated on at least a portion of the cathode surface in order to reduce sputtering of the electrode material. The linear source includes a linear shell (which is the cathode and grounded) inside of which lies a concentric anode (which is at a positive potential). This geometry of cathode-anode and magnetic field 33 gives rise to a closed drift condition. The anode layer ion source can also work in a reactive mode. The source includes a metal housing with a slit in a shape of a race track as shown in FIGS. 7–8. The hollow housing is at ground potential. The anode electrode is situated within the cathode body (though electrically insulated) and is positioned just below the slit. The anode can be connected to a positive potential as high as 3,000 or more volts (V). Both electrodes may be water cooled in certain embodiments. Feedstock/precursor gases (e.g., $CF_4$, $NF_3$, Ar, $O_2$ and/or $N_2$, or any combination thereof) described herein, are fed through the cavity between the anode and cathode (or alternatively may be otherwise provided at the source). The linear ion source also contains a labyrinth system that distributes the precursor gas(es) fairly evenly along its length and which allows it to expand between the anode-cathode space internally. The electrical energy then cracks the gas(es) to produce a plasma within the source. The ions (e.g., Ar+ ions, O ions, and/or F ions) are expelled out at energies in the order of eVc-a/2 when the voltage is Vc-a. The ion beam emanating from the slit is approximately uniform in the longitudinal direction and has a Gaussian profile in the transverse direction. Exemplary ions 34 in ion beam B are shown in FIG. 8. A source as long as 1–4 meters may be made, although sources of different lengths are anticipated in different embodiments of this invention. Electron layer 35 completes the circuit thereby enabling the ion beam source to function properly. Still referring to FIGS. 7–8, a feedstock gas(es) may be fed through the ion beam source via cavity 42 until it/they reach the area near slit 44 where it/they is/are ionized.

The ion beam source of FIGS. 7–8 is merely exemplary. Thus, in alternative embodiments of this invention, an ion beam source device or apparatus as described and shown in FIGS. 1–3 of U.S. Pat. No. 6,002,208 (hereby incorporated herein by reference in its entirety) may be used to ion beam treat and/or mill substrate 1 and/or 3. Any other suitable type of ion source may also be used.

Figure 9:
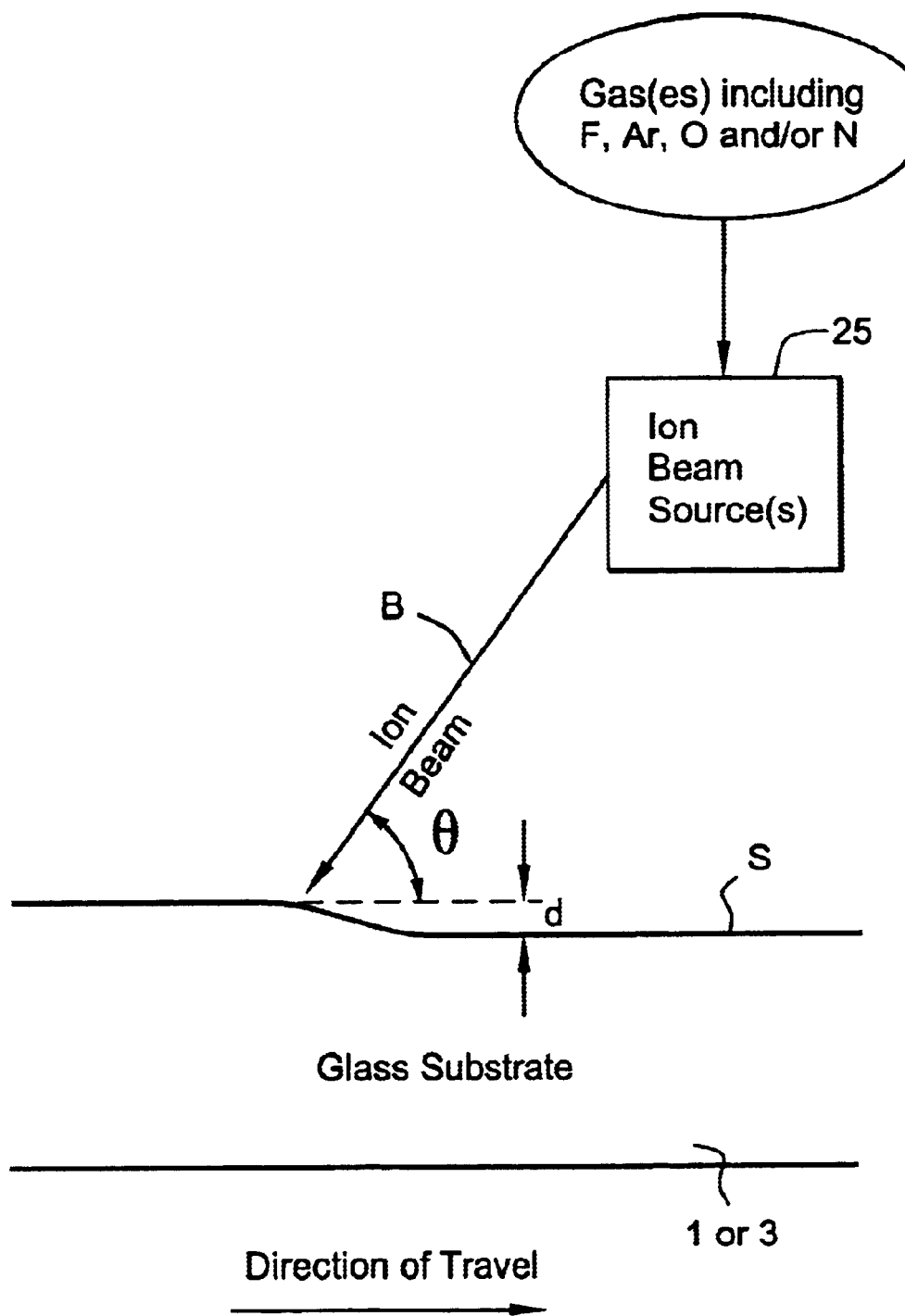
FIG. 9 is a schematic diagram illustrating ion beam milling of a glass substrate according to an example embodiment of this invention.

FIG. 9 illustrates a glass substrate (1 or 3) being ion beam milled according to an example embodiment of this invention using ion source 25. As shown, the ion beam B (diffused, collimated, or focused) from ion source 25 is incident upon the surface S of the glass substrate at an angle θ. Beam incidence angle θ, between the ion beam and the substrate surface, may be from about 0–90 degrees in different embodiments of this invention, more preferably from about 20–70 degrees, and most preferably from about 30–60 degrees. Surprisingly, it has been found that an angle of from 20–70 degrees, more preferably from 30–60 degrees, results in more efficient milling of the glass substrate surface S. It can also be seen that ion beam B hitting the glass substrate causes a thickness amount "d" of glass to be milled off of (i.e., removed from) the substrate. As stated above, the ion beam B mills off at least about 2 Å of glass from the substrate, more preferably at least about 5 Å of glass from the substrate, even more preferably from about 5–500 Å of glass from the substrate, still more preferably from about 10–100 Å of glass from the substrate 1, and most preferably from about 20–80 Å of glass from the substrate. When F for example, is in the ion beam, Na present at or near the substrate surface may be reduced as discussed above for the aforesaid beneficial purpose(s).

Figure 10:
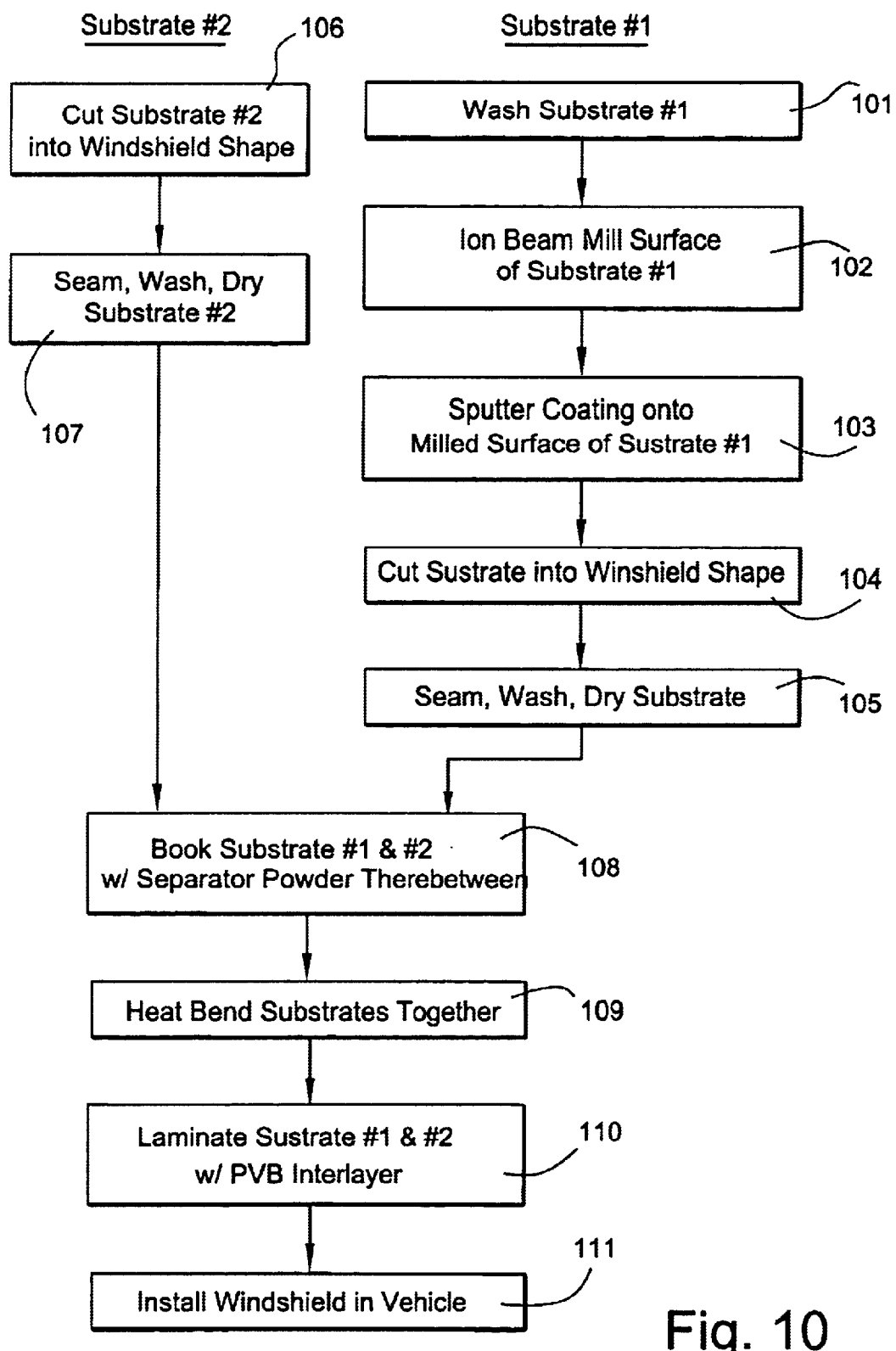
FIG. 10 is a flowchart illustrating certain steps taken in making a vehicle windshield according to an example embodiment of this invention.

While ion beam milling herein may be used to make laminated windows (e.g., architectural windows, vehicle side windows or backlites), a preferred used is for vehicle windshields. FIG. 10 is a flowchart illustrating in detail a example non-limiting way in which a vehicle windshield may be made using ion beam milling according to an embodiment of this invention (this process may be used to make the windshields of any of FIGS. 1, 2 and 6). As illustrate, first and second glass substrates are provided (i.e., substrate #1 and substrate #2). As for the first substrate, it optionally may be washed (step 101). At least one surface of the first substrate is then ion beam milled as shown in FIG. 9 (step 102). A coating 5 is then sputtered onto the ion beam milled surface S of the first substrate (step 103). Optionally, both surfaces of the substrate may be ion beam milled. The coating 5 may be a low-E coating, or any other suitable solar control coating. The ion beam milled and coated first substrate is then cut into the shape to be used in a windshield (step 104). It is then, optionally, seamed, washed and dried (step 105). Meanwhile, a second substrate is cut to size (step 106) and optionally may be seamed, washed and dried (step 107). The second substrate may or may not be ion beam milled (one or both surfaces thereof) in different embodiments of this invention. After both substrates have been cut to size, they are booked with separator powder therebetween (step 108). They are then heat treated and bent into the desired windshield shape (step 109), and laminated together via a polymer based interlayer 7 (step 110). The resulting windshield may then be installed in a vehicle window frame (step 111). This detailed process is provided for purpose of example only, and is not intended to be limiting unless specifically claimed.

Figure 11:
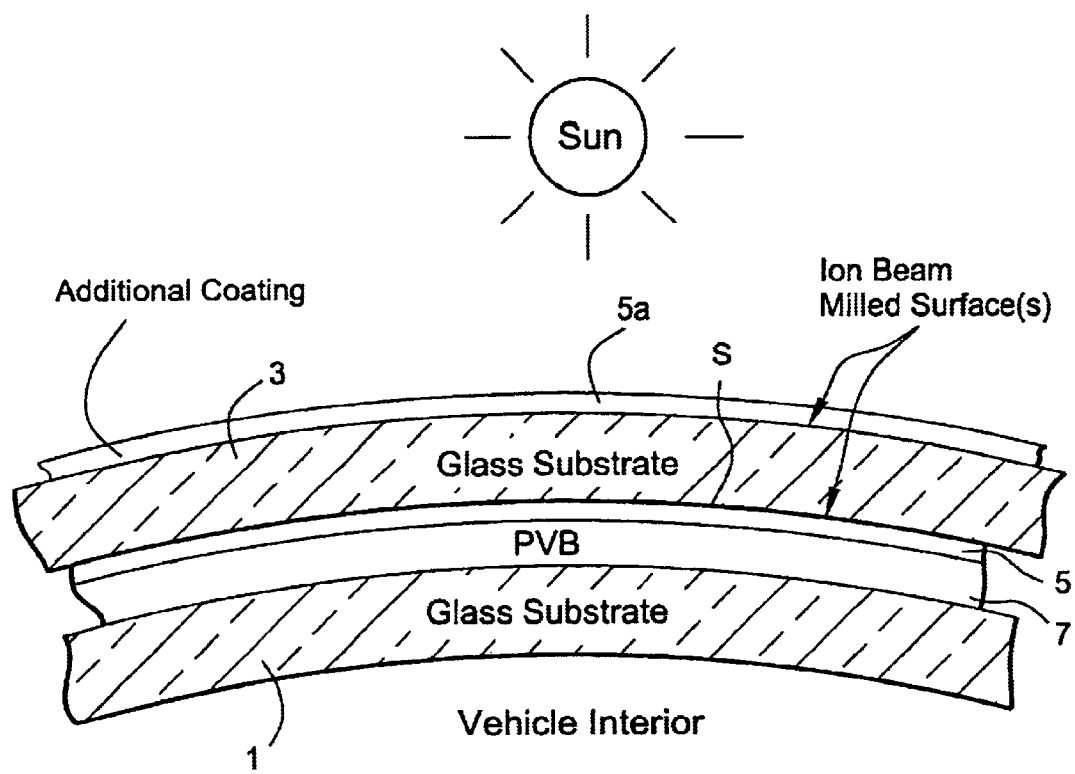
FIG. 11 is a side cross sectional view of a coated article according to another embodiment of this invention.

FIG. 11 is a cross sectional view of a coated article (e.g., vehicle windshield or other window) according to another embodiment of this invention. This embodiment is similar to that of FIG. 2 described above, except that an additional coating 5a is provided on the side of substrate 3 opposite coating 5. Coating 5 may be as described above, while coating 5a on the other side (e.g., the exterior side) of substrate 3 may be of or include diamond-like carbon (DLC) or any other suitable coating that may be hydrophobic (contact angle>=70 degrees), hydrophillic (contact angle<= 15 degrees), and/or scratch resistant. In certain embodiments, additional coating 5a may even provide IR and/or UV reflection functionality. Since one of coatings 5 and 5a in the FIG. 11 embodiment is formed on the tin side of the glass substrate 3, ion beam milling is used to remove much tin from the tin side of the glass substrate in order to improve yields and/or optical characteristics/durability of the resulting product. In the FIG. 11 embodiment, both sides of the glass substrate 3 may be ion beam milled as described herein, or alternatively only the tin side of the substrate may be ion beam milled as described herein. In still further alternative embodiments (applicable to IG units and vehicle windshields), coating 5 may be provided on the interior surface of one of the substrates while the additional coating 5a is provided on the exterior surface of the other substrate.

Figure 12:
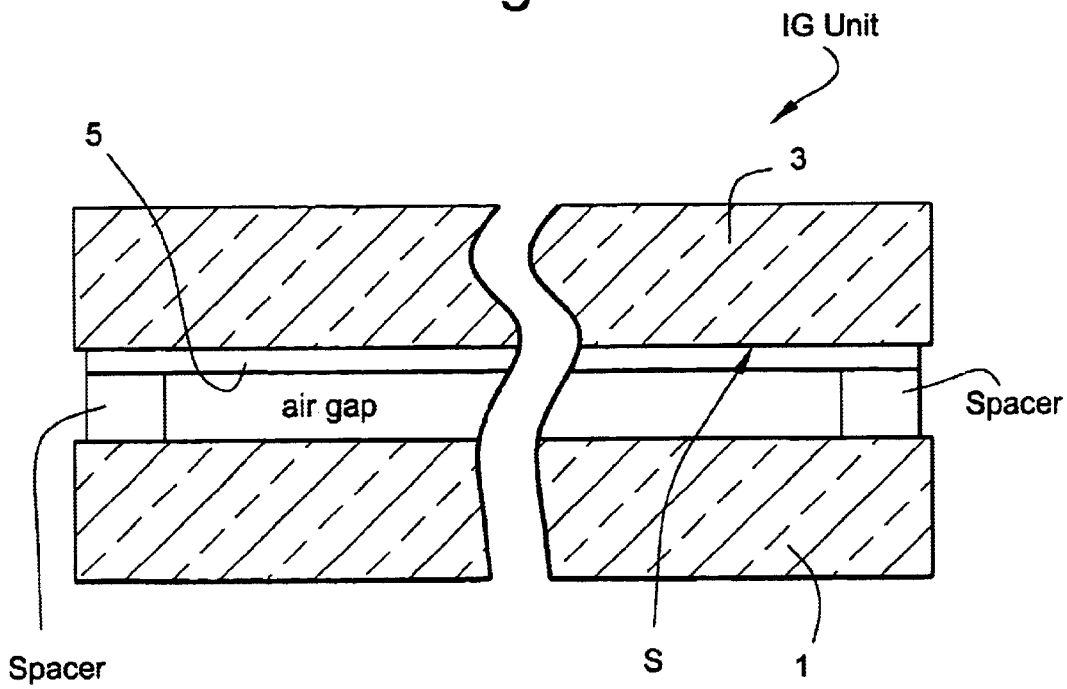
FIG. 12 is a side cross sectional view of an insulating glass (IG) window unit according to another example embodiment of this invention.

While the aforesaid embodiments are directed primarily toward laminated windows, this invention is not so limited unless specifically claimed. In certain alternative embodiments of this invention, the ion beam treating and/or milling may be used in the context of insulating glass (IG) window units where the two glass substrate are spaced apart from one another via at least one spacer and an air/gas gap (see FIG. 12). The gap between the substrates may or may not be at a pressure less than atmospheric in different embodiments of this invention. In such IG window unit embodiments, a surface of at least one of the substrates to receive a coating 5 (e.g., any of the coatings mentioned above) is ion beam treated and/or milled as discussed herein. Moreover, in addition to windows such as vehicle windshields, and IG window units, the ion beam treating and/or milling according to other embodiments of this invention may be used in the process of making other types of windows such as vehicle backlites, vehicle side windows, and/or various types of architectural windows for skyscrapers, office buildings, apartment buildings, residences, and/or the like.

Figure 13:
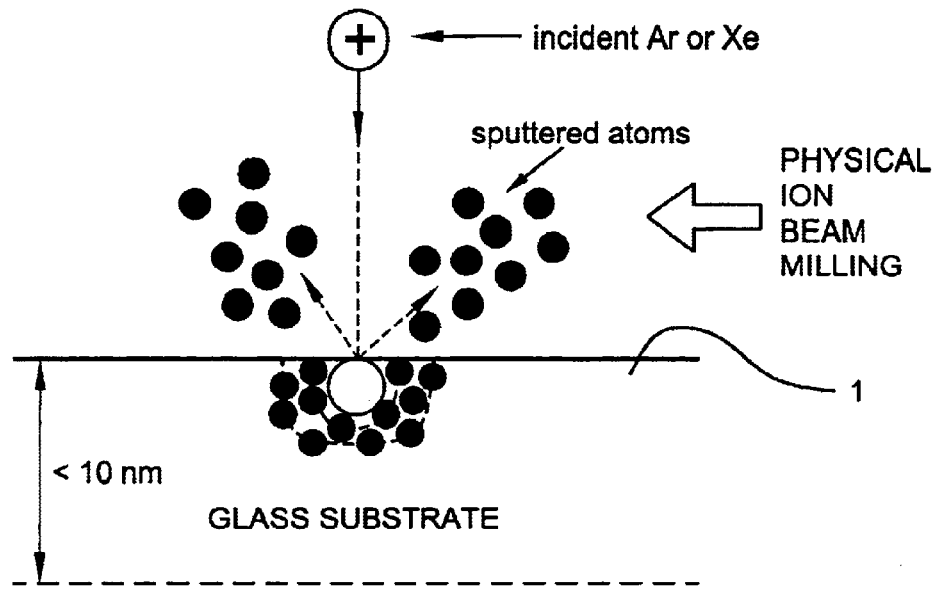
FIG. 13(a) is a schematic diagram illustrating an example of how ion beam milling results in atoms of the substrate being sputtered off of the substrate during an example milling process.
FIG. 13(b) is a schematic diagram illustrating each of ion implantation into a substrate, ion beam milling using a reactive gas (e.g., F and/or O), and ion beam deposition of a layer or coating on a substrate.
Figure 13:
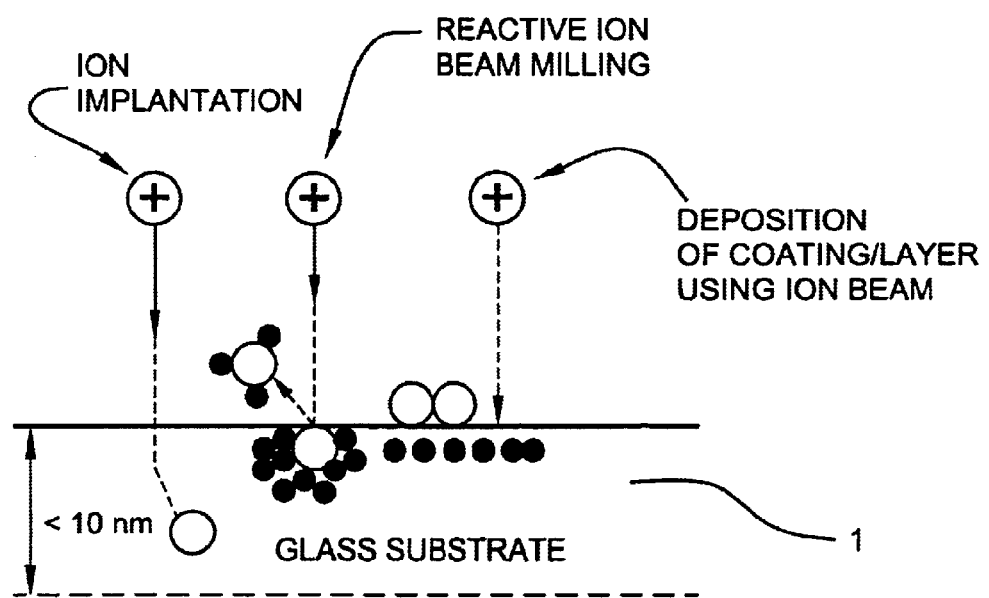

FIG. 13(a) is a schematic diagram illustrating an example of how ion beam milling results in atoms of the substrate being sputtered off of the substrate during an example milling process. In FIG. 13(a), an inert gas ion (e.g., Ar or Xe) is shown proceeding toward the glass substrate to be milled. The ion impinges upon the substrate and causes atoms of the substrate to be sputtered off of the substrate. In other words, the sputtered material is milled off of the substrate 1. This is known as physical ion beam milling, since the ion (e.g., Ar or Xe) is not reactive.

FIG. 13(b) shows each of ion implantation into substrate 1, reactive ion beam milling, and ion beam deposition. On the far left-hand side of FIG. 13(b), an ion (e.g., F ion) is shown entering the substrate and being subimplanted in a surface area thereof. In the middle portion of FIG. 13(b), a reactive ion (e.g., F, O or N) is seen heading toward the substrate 1 to be treated and/or milled. The reactive ion reaches the substrate and reacts with material at the substrate surface and then proceeds with such material away from the substrate in reacted form. Finally, the far-right hand portion of FIG. 13(b) illustrates deposition of a coating (e.g., coating of DLC) on the substrate 1, as opposed to any treating or milling process.

Certain terms are prevalently used in the glass coating art, particularly when defining the properties and solar management characteristics of coated glass. Such terms are used herein in accordance with their well known meaning. For example, as used herein:

Intensity of reflected visible wavelength light, i.e. "reflectance" is defined by its percentage and is reported as $R_XY$ or $R_X$ (i.e. the Y value cited below in ASTM E-308-85), wherein "X" is either "G" for glass side or "F" for film side. "Glass side" (e.g. "G") means, as viewed from the side of the glass substrate opposite that on which the coating resides, while "film side" (i.e. "F") means, as viewed from the side of the glass substrate on which the coating resides. Color characteristics are measured and reported herein using the CIE LAB 1976 a*, b* coordinates and scale.

The terms "emissivity" (or emittance) and "transmittance" are well understood in the art and are used herein according to their well known meaning. Thus, for example, the term "transmittance" herein means solar transmittance, which is made up of visible light transmittance (TY of $T_{vis}$), infrared energy transmittance ($T_{IR}$), and ultraviolet light transmittance ($T_{uv}$). Total solar energy transmittance (TS or $T_{solar}$) can be characterized as a weighted average of these other values. With respect to these transmittances, visible transmittance may be characterized for architectural purposes by the standard Illuminant C, 2 degree technique; while visible transmittance may be characterized for automotive purposes by the standard III. A 2 degree technique (for these techniques, see for example ASTM E-308-95). For purposes of emissivity a particular infrared range (i.e. 2,500–40,000 nm) is employed.

The term $R_{solar}$ refers to total solar energy reflectance (glass side herein), and is a weighted average of IR reflectance, visible reflectance, and UV reflectance. This term may be calculated in accordance with the known DIN 410 and ISO 13837 (12/98) Table 1, p. 22 for automotive applications, and the known ASHRAE 142 standard for architectural applications.

"Haze." Light diffused in many directions causes a loss in contrast. The term "haze" is defined herein in accordance with ASTM D 1003 which defines haze as that percentage of light which in passing through deviates from the incident beam greater than 2.5 degrees on the average. "Haze" may be measured herein by a Byk Gardner haze meter (all haze values herein are measured by such a haze meter and are unitless).

Another term employed herein is "sheet resistance". Sheet resistance ($R_s$) is a well known term in the art and is used herein in accordance with its well known meaning. It is here reported in ohms per square units. Generally speaking, this term refers to the resistance in ohms for any square of a layer system on a glass substrate to an electric current passed through the layer system. Sheet resistance is an indication of how well the layer or layer system is reflecting infrared energy, and is thus often used along with emissivity as a measure of this characteristic. "Sheet resistance" may for example be conveniently measured by using a 4-point probe ohmmeter, such as a dispensable 4-point resistivity probe with a Magnetron Instruments Corp. head, Model M-800 produced by Signatone Corp. of Santa Clara, Calif. Coatings 5 herein may have a sheet resistance of less than or equal to 10 ohms/sq., more preferably less than or equal to 5 ohms/sq.

While the invention has been described in connection with what is presently considered to be the most practical and preferred embodiment, it is to be understood that the invention is not to be limited to the disclosed embodiments, but on the contrary, is intended to cover various modifications and equivalent arrangements included within the spirit and scope of the appended claims.

What is claimed is:

1. A method of making a window including at least one glass substrate, the method comprising:
   providing a first glass substrate;
   ion beam treating a surface of the first glass substrate with an ion beam comprising at least fluorine (F) ions thereby forming an ion beam treated surface of the first glass substrate; and
   following said ion beam treating, sputtering a coating including at least one infrared (IR) reflecting layer on the ion beam treated surface of the first glass substrate.

2. The method of claim 1, wherein said ion beam treating further comprises ion beam milling the surface of the first glass substrate so as to remove at least 2 Å of glass from at least a portion thereof and form an ion beam milled surface of the first glass substrate.

3. The method of claim 1, further comprising laminating the first glass substrate with the coating thereon to a second substrate via a polymer inclusive interlayer so that the coating and the interlayer are provided between the first and second substrates.

4. The method of claim 1, wherein the IR reflecting layer comprises silver (Ag), and wherein the IR reflecting layer comprising Ag is located between at least first and second dielectric layers, and wherein the ion beam further includes ions from at least one inert gas.

5. The method of claim 1, wherein the coating comprises at least first and second IR reflecting layers each comprising Ag.

6. The method of claim 2, wherein said ion beam milling removes at least 5 Å of glass from the first glass substrate.

7. The method of claim 2, wherein said ion beam milling removes from 10–100 Å of glass from the first glass substrate.

8. The method of claim 3, wherein the polymer inclusive interlayer comprises polyvinyl butyral (PVB), and wherein the ion beam is diffused.

9. The method of claim 1, wherein the coated article comprises a vehicle windshield made so as to have at least one of the following characteristics:

| | |
|---|---|
| visible transmittance (Ill. A, 2 deg.): | >= 70% |
| haze: | <= 0.4%. |

10. The method of claim 1, wherein the coating has a sheet resistance ($R_s$) of less than or equal to 10 ohms/sq.

11. The method of claim 10, wherein the coating has a sheet resistance ($R_s$) of less than or equal to 5 ohms/sq.

12. The method of claim 1, further comprising making the first glass substrate via a float process so as to include sodium (Na) and utilizing a tin bath so as to cause the first glass substrate to have a tin surface and a non-tin surface, and wherein the ion beam treating is performed on the non-tin surface of the first glass substrate.

13. The method of claim 1, further comprising: after said sputtering, heat treating the first glass substrate with the coating thereon so as to temper and/or bend the first glass substrate.

14. The method of claim 2, wherein the ion beam milling reduces haze in the windshield by at least about 20%.

15. The method of claim 2, wherein the ion beam milling comprises directing the ion beam at the surface of the first glass substrate so that the ion beam is incident upon the surface of the first glass substrate so as to form an angle θ with the first glass substrate of from 20–70 degrees.

16. The method of claim 2, wherein the ion beam milling comprises directing an ion beam at the first glass substrate so that the ion beam is incident upon the first substrate in order to form an angle θ with the first glass substrate of from 30–60 degrees.

17. The method of claim 1, wherein the ion beam treating comprises generating and directing the ion beam comprising at least fluorine (F) ions toward the first glass substrate in a manner so that F ions and/or molecules is/are subimplanted into the glass substrate.

18. The method of claim 1, wherein said ion beam treating comprises generating an ion beam including each of argon, oxygen and fluorine ions, and directing the ion beam including the argon, oxygen and fluorine ions toward the surface of the first glass substrate.

19. A method of making a window including at least one glass substrate, the method comprising:
   providing a first glass substrate;
   ion beam milling a surface of the first glass substrate with an ion beam comprising at least ions of a Group VII A element so as to remove at least 2 Å of glass from the first glass substrate thereby forming an ion beam milled surface of the first glass substrate; and
   following said ion beam milling, forming a coating on the ion beam milled surface of the first glass substrate.

20. The method of claim 19, wherein the ion beam comprises at least ions of F.

21. A method of making a window comprising:
   providing a first glass substrate;
   ion beam milling a surface of the first glass substrate with an ion beam comprising at least argon and oxygen ions so as to remove at least 2 Å of glass from at least a portion of the first glass substrate thereby forming an ion beam milled surface of the first glass substrate; and following said ion beam milling, sputtering a coating including at least one infrared (IR) reflecting layer on the ion beam milled surface of the first glass substrate.

22. The method of claim 21, further comprising, following said ion beam milling and sputtering, coupling the first glass substrate with the coating thereon to a second substrate in order to form the window.

23. The method of claim 21, wherein the ion beam further comprises fluorine ions in addition to the argon and oxygen ions.

24. The method of claim 21, wherein the ion beam further comprises nitrogen ions in addition to the argon and oxygen ions.

25. A method of making a window, the method comprising:
providing first and second glass substrates;
ion beam milling at least one surface of the first glass substrate using an ion beam comprising argon and fluorine ions so as to remove at least 2 Å of glass from at least a portion of the first glass substrate and form an ion beam milled surface of the first glass substrate,
forming a coating on the ion beam milled surface of the first substrate; and
coupling the first glass substrate with the coating thereon to the second glass substrate so that the coating is provided between the first and second glass substrates.

26. The method of claim 25, wherein the ion beam milling comprises directing the ion beam at the surface of the first substrate so that the ion beam is incident upon the surface of the first glass substrate to form an angle θ with the first substrate of from 20–70 degrees.

27. The method of claim 25, wherein the coating comprises first and second layers comprising Ag.

28. The method of claim 27, wherein the coating further comprises:
a first dielectric layer provided between the first substrate and the first layer comprising Ag,
a second dielectric layer between the first and second layers comprising Ag, and
a third dielectric layer between the second layer comprising Ag and a polymer inclusive interlayer that laminates the first and second substrates to one another.

29. The method of claim 25, wherein said ion beam milling removes at least 5 Å of glass from the first glass substrate.

30. The method of claim 25, wherein said ion beam milling removes from 10–100 Å of glass from the first glass substrate.

31. The method of claim 25, wherein the window has a visible transmittance of at least 70%.

32. The method of claim 25, wherein the window has haze of <=0.4.

33. A method of making a window including at least one glass substrate, the method comprising:
providing a first glass substrate;
ion beam milling a surface of the first glass substrate with a diffused ion beam so as to remove at least 2 Å of glass from at least a portion thereby forming an ion beam milled surface of the first glass substrate; and
following said ion beam milling, forming a coating including at least one infrared (IR) reflecting layer on the ion beam milled surface of the first glass substrate.

34. The method of claim 33, wherein the diffused ion beam comprises at least one of: a) Ar ions, b) F ions, c) O ions, and d) N ions.

35. The method of claim 33, wherein the diffused ion beam comprises F and Ar ions.

36. The method of claim 33, wherein the diffused ion beam comprises both inert and reactive ions.

37. The method of claim 33, wherein the diffused ion beam enables milling to be carried out at a quicker rate than if a collimated ion beam was used.

38. A method of making a window comprising:
providing a first glass substrate;
ion beam milling a surface of the first glass substrate with an ion beam comprising at least oxygen ions so as to remove at least 2 Å of glass from at least a portion of the first glass substrate thereby forming an ion beam milled surface of the first glass substrate; and
following said ion beam milling, sputtering a coating including at least one infrared (IR) reflecting layer on the ion beam milled surface of the first glass substrate.

39. The method of claim 38, wherein the ion beam milling using at least oxygen ions causes a thin film comprising an oxide to be formed on at least part of a surface of an electrode of an ion beam source that generates the ion beam.

40. The method of claim 39, wherein the oxide comprises iron oxide.

41. The method of claim 19, wherein the coating comprises at least one layer comprising silver.

42. The method of claim 19, wherein the coating comprises at least first and second layers comprising silver with at least one dielectric layer provided therebetween.

43. The method of claim 21, wherein the coating comprises at least first and second layers comprising silver with at least one dielectric layer provided therebetween.

44. A method of making a coated article, the method comprising:
providing a first glass substrate;
ion beam milling a surface of the first glass substrate with an ion beam so as to remove at least 5 Å of glass from at least a portion of the first glass substrate thereby forming an ion beam milled surface of the first glass substrate; and
following said ion beam milling, sputtering a coating onto the ion beam milled surface of the first glass substrate, wherein the coating comprises at least the following layers from the first glass substrate outwardly:
a first dielectric layer;
a first IR reflecting layer comprising silver;
a second dielectric layer;
a second IR reflecting layer comprising silver; and
a third dielectric layer; and
wherein the coating has a sheet resistance of less than or equal to 10 ohms/square.

45. The method of claim 44, wherein the second dielectric layer comprises at least one of silicon nitride and tin oxide.

46. The method of claim 44, wherein the third dielectric layer comprises silicon nitride.

47. The method of claim 44, wherein the coating further comprises a contact layer comprising an oxide of NiCr provided between the second IR reflecting layer and the third dielectric layer.

48. The method of claim 44, further comprising thermally tempering and/or heat bending the first glass substrate with the coating thereon, and coupling the heat treated first glass substrate with the coating thereon to a second glass substrate so as to form a window.

49. The method of claim 48, wherein the window is a vehicle windshield.

50. The method of claim 48, wherein the window is an IG window unit.

51. The method of claim 44, wherein the ion beam comprises at least one of F ions, O ions and Ar ions.

* * * * *